United States Patent
Kelly

(10) Patent No.: US 8,269,409 B2
(45) Date of Patent: Sep. 18, 2012

(54) METHOD OF FABRICATING A LIGHT-EMITTING DEVICE (LED) UTILIZING POWDER/PELLETIZED HOMOGENEOUSLY MIXED MOLDING COMPOUND

(75) Inventor: Stephen G. Kelly, Melrose, MA (US)

(73) Assignee: Microsemi Corporation, Irvine, CA (US)

( * ) Notice: Subject to any disclaimer, the term of this patent is extended or adjusted under 35 U.S.C. 154(b) by 1257 days.

(21) Appl. No.: 11/079,323

(22) Filed: Mar. 14, 2005

(65) Prior Publication Data
US 2005/0158908 A1 Jul. 21, 2005

Related U.S. Application Data

(62) Division of application No. 10/623,229, filed on Jul. 18, 2003, now abandoned.

(60) Provisional application No. 60/397,082, filed on Jul. 19, 2002.

(51) Int. Cl.
*H01J 1/62* (2006.01)
*C09K 11/56* (2006.01)
*C08K 3/22* (2006.01)
*H01L 21/44* (2006.01)

(52) U.S. Cl. ............... 313/501; 313/502; 252/301.17; 252/301.33; 523/334; 524/346; 438/29; 438/127

(58) Field of Classification Search ............. 252/301.17, 252/301.33; 313/501, 502; 438/29, 127; 523/334; 524/346
See application file for complete search history.

(56) References Cited

U.S. PATENT DOCUMENTS

| | | | | | |
|---|---|---|---|---|---|
| 4,708,839 | A | * | 11/1987 | Bellet et al. | 264/85 |
| 5,089,426 | A | * | 2/1992 | Yamazaki et al. | 438/80 |
| 5,098,626 | A | * | 3/1992 | Pas | 264/151 |
| 5,369,192 | A | * | 11/1994 | Ko et al. | 525/484 |
| 5,644,156 | A | * | 7/1997 | Suzuki et al. | 257/485 |
| 5,813,753 | A | * | 9/1998 | Vriens et al. | 362/293 |
| 5,958,573 | A | * | 9/1999 | Spitler et al. | 428/323 |
| 5,998,925 | A | * | 12/1999 | Shimizu et al. | 313/503 |
| 6,066,861 | A | * | 5/2000 | Hohn et al. | 257/99 |
| 6,120,716 | A | * | 9/2000 | Kushida et al. | 264/117 |
| 6,156,141 | A | * | 12/2000 | Shirakawa | 156/67 |
| 2002/0195935 | A1 | * | 12/2002 | Jager et al. | 313/512 |
| 2003/0001140 | A1 | * | 1/2003 | Starkey | 252/301.35 |
| 2003/0104743 | A1 | * | 6/2003 | Weberg et al. | 442/286 |

OTHER PUBLICATIONS http://composite.about.com/library/glossary/s/bldef-s4931.htm, Jul. 24, 2007.
http://n479ad.doubleclick.net/adi/abt.money/money_composite:svc=site=composite:t=0;bt=1:bts=1;pc=3:auc=2;fd=2;fs=1;sp2, Jul. 24, 2007.
http://en.wikipedia.org/wiki/B-staging, Jul. 24, 2007.
http://en.wikipedia.org/wiki/Sintering, Jul. 24, 2007.

* cited by examiner

*Primary Examiner* — Anh Mai
(74) *Attorney, Agent, or Firm* — Marger, Johnson & McCollom, P.C.

(57) ABSTRACT

The present invention comprises a process of mixing a luminous substance in powder form to a transferable grade molding compound in a pelletized or powder form, such as a clear epoxy, to derive a homogeneous mixture that can be pressed and sintered into solid pellets. The solid pellets are further processed so as to permit their deposition on and around a light emitting semiconductor driver so as to obtain a white light emitting semiconductor device. This white light emitting device can be used in a variety of lighting applications.

20 Claims, No Drawings

METHOD OF FABRICATING A LIGHT-EMITTING DEVICE (LED) UTILIZING POWDER/PELLETIZED HOMOGENEOUSLY MIXED MOLDING COMPOUND

CROSS REFERENCE TO RELATED APPLICATIONS

This application is a divisional of prior U.S. patent application Ser. No. 10/623,229, filed Jul. 18, 2003 now abandoned, entitled "PROCESS FOR PREPARING, AND DEVICE RESULTING FROM, A HOMOGENOUSLY MIXED POWDER/PELLETIZED COMPOUND FOR USE IN LIGHT EMITTING SEMICONDUCTOR DEVICES", which claims priority to U.S. provisional patent application No. 60/397,082, filed Jul. 19, 2002, entitled PROCESS FOR PREPARING, AND DEVICE RESULTING FROM, A HOMOGENOUSLY MIXED POWDER/PELLETIZED COMPOUND FOR USE IN LIGHT EMITTING SEMICONDUCTOR DEVICES, the entire contents of which are incorporated herein by this reference. The above-listed applications are commonly assigned with the present invention and are incorporated herein by reference. The Applicants hereby claim the benefits of the earlier pending provisional application under 35 U.S.C. Section 119(e) and the pending parent application.

TECHNICAL FIELD OF THE INVENTION

The present invention relates to processes for preparing compositions used in the fabrication of light emitting semiconductor devices, and also relates to the devices resulting from the use of said process.

BACKGROUND OF THE INVENTION

LEDs are used in a variety of applications, such as displays, illumination in control panels, in traffic lights and electronic devices. An LED is a semiconductor device that converts electrical energy into optical energy. This occurs when a forward bias is applied to the device, resulting in holes in the P-type semiconductor material combining with the electrons in the N-type semiconductor material at the P-N junction. A "white" light emitting diode uses a blue light emitting diode as the source of the light. A luminous material layered over the blue light emitting diode acts to partly absorb the blue light and convert it into yellow or yellowish green light. When mixed, the blue and yellow/yellowish green light combine as white light.

A conventional method of producing white light emitting devices includes a process in which yttrium aluminate ("YAG") is directly deposited onto a light emitting diode ("LED") chip surface in order to produce LEDs that emit white light. However, a disadvantage of said process, and the resulting LED, is that the color temperature from such a white LED is not uniform over a plurality of angular positions due to the non-uniform thickness of the YAG over the LED chip surface. Further, this unequal distribution of color temperature occurs on a device by device basis within the same lot.

In addition, at elevated drive current, bleed-through of radiation in the ultra-violet ("UV") range can occur. The use of the conventional process in producing these "white" light emitting devices disadvantageously results in package complexity, leading to limited ruggedness and decreased reliability of the devices.

SUMMARY OF THE INVENTION

The present invention comprises a process of mixing a luminous substance in powder form to a transferable grade molding compound in a pelletized or powder form, such as a clear epoxy, to derive a homogeneous mixture that can be pressed and sintered into solid pellets. The solid pellets are further processed so as to permit their deposition on and around a light emitting semiconductor driver so as to obtain a "white" light emitting semiconductor device. This "white" light emitting device can be used in a variety of lighting applications.

DETAILED DESCRIPTION OF THE DISCLOSED PROCESS AND DEVICE

The present invention discloses a process for adding a luminous substance in powder form to a transferable grade molding compound in pellet or powder form to derive a homogeneous mixture that can be pressed and sintered into pellets so as to obtain a "white" light emitting semiconductor device.

In an embodiment of the invention, the luminous powdered substance is a Cerium doped garnet, such as the inorganic luminous substance YAG:Ce. In this embodiment, YAG:Ce is homogeneously admixed with a pelletized molding compound, such as a clear epoxy. Although YAG:Ce has an index of refraction of about 1.84, resulting in good mixing of blue diode emissions with yellow/yellowish green converter radiation, any type of luminous substance in powder form can be used in the disclosed process. Other luminous substance powders that can be homogenously distributed within the molding compound include but are not limited to other garnets doped with rare earths.

The particle sizes of the luminous powdered substances are less than or equal to 5 microns and can be spherical or flake-like in shape. Different chromaticity can be obtained by adjusting the luminous powder's (i) percentage by weight of the combined material and (ii) micron size, before admixing and pelletizing. Because of the characteristics of the mixture, no sedimentation of the substance occurs and the mixture remains homogeneous. The powder and pellets must be stored in Nitrogen before and during production as they are susceptible to moisture. Because the luminous powder added to the epoxy changes its spiral flow, the transfer pressure must be increased 10% to 15% of manufacturer's recommended settings. As used with the Microsemi(r) PM3 package, a "color tunable" device can be produced. The disclosed process can also be used to convert the wavelength of blue, green or ultra-violet light of LEDs to other wavelengths.

By providing uniformity in concentration by weight and homogeneous disposition of the luminous substance within the molding compound, uniform distribution of color temperature can be achieved. Using the disclosed process to control the percentage weight of the luminous substance, such as YAG, to the molding compound, such as a clear epoxy, ensures uniform distribution of color temperature. Furthermore, use of the disclosed process allows a more robust injection molded package. This is accomplished by depositing the admixed substance around the LED chip atop a copper lead frame Specifically, pellets are taken from a freezer and stored in Nitrogen until they reached room temperature. They are then removed from the Nitrogen box and placed in a feed bowl to be loaded into a mold shuttle for transfer. The feed bowl and mold shuttle are purged with nitrogen to keep the pellets dry. The use of this process advantageously results in no UV bleed through at elevated drive current.

More specifically, the powder/pelletized composition includes, among other things, the following parts:

(a) molding compound, such as a clear epoxy;

(b) luminous substances, such as YAG:Ce;

(c) thixotorpic agent, such as pyrogenic silicic acid, to thicken the epoxy casting resin;

(d) mineral diffuser, such as CaF2, for optimizing the luminous pattern of the composition;

(e) processing adjuvant, such as glycol ether or surface modifiers based on silicone, to improve the compatibility between the epoxy and the luminous substance;

(f) hydrophobic agent, such as liquid silicone wax to modify the pigment surface; and (g) adhesion promoters, to improve the adhesion between the pigments and the epoxy.

The innovative teachings of the present invention are described with particular reference to the disclosed embodiment. However, it should be understood that the embodiment provides only one example of the many advantageous uses and innovative teachings herein. Various alterations, modifications and substitutions can be made to the disclosed invention without departing in any way from the spirit and scope of the invention.

What is claimed is:

1. A method of fabricating a light emitting chip comprising:
    pressing and sintering a homogeneous mixture of epoxy and a luminous substance into solid pellets; and
    processing the solid pellets for application on a semiconductor surface.

2. The method of claim 1, further comprising depositing the homogeneous mixture of epoxy and the luminous substance around an LED chip located on a copper lead frame.

3. The method of claim 2, further comprising the LED chip having a semiconductor junction operable to emit light when biased; and
    the homogenous mixture of epoxy and the luminous substance adapted to filter and combine predetermined wavelengths of light from the semiconductor junction.

4. The method of claim 3, further comprising the luminous substance being in powder form of less than or equal to 5 microns in size prior to sintering and pelletization.

5. The method of claim 3, further comprising incorporating a thixotorpic agent to thicken the epoxy.

6. The method of claim 3, wherein the luminous substance further comprises a Cerium doped garnet.

7. The method of claim 3, wherein the luminous substance further comprises YAG:Ce.

8. The method of claim 3, wherein the luminous substance includes a predetermined amount of mineral diffuser so as to optimize a luminous pattern.

9. The method of claim 7, wherein the mineral diffuser comprises CaF2.

10. The method of claim 3, further comprising predetermining a chromaticity of emitted light based on the luminous substance's percentage by weight of the homogeneous mixture and micron size, before pelletizing.

11. The method of claim 1 wherein the solid pellets are cooled after sintering in a manner reducing UV bleed through at an elevated drive current than without said cooling.

12. A method of fabricating a light emitting device, comprising:
    admixing a luminous substance with a transferable grade molding compound to derive a homogeneous mixture;
    pressing and sintering the homogeneous mixture into solid pellets; and
    depositing the processed solid pellets on a semiconductor surface.

13. A method of fabricating a light emitting device, comprising:
    admixing a luminous substance with a transferable grade molding compound to derive a homogeneous mixture;
    pressing and sintering the homogeneous mixture into solid pellets;
    storing the solid pellets in a freezer;
    removing the solid pellets from the freezer;
    raising a temperature of the solid pellets to room temperature;
    processing the solid pellets for application on a semiconductor surface; and
    depositing the processed solid pellets on a semiconductor surface.

14. The method of fabricating a light emitting device of claim 13 wherein the molding compound is in a pelletized form prior to pressing and sintering the homogeneous mixture into solid pellets.

15. The method of fabricating a light emitting device of claim 14 wherein the pelletized molding compound further comprises a clear epoxy.

16. The method of fabricating a light emitting device of claim 13 wherein the molding compound is in a powdered form prior to pressing and sintering the homogeneous mixture into solid pellets.

17. The method of fabricating a light emitting device of claim 16 wherein the powdered molding compound further comprises a clear epoxy.

18. The method of fabricating a light emitting device of claim 13 wherein the luminous substance is in powdered form prior to pressing and sintering the homogeneous mixture into solid pellets.

19. The method of claim 13 wherein raising a temperature of the solid pellets to room temperature comprises storing the solid pellets in a gas until they reach about room temperature.

20. The method of claim 19 wherein the gas is Nitrogen.

* * * * *